United States Patent [19]
Scott et al.

[11] Patent Number: 6,059,451
[45] Date of Patent: May 9, 2000

[54] METHOD FOR IMPROVING FAULT COVERAGE OF AN ELECTRIC CIRCUIT

[75] Inventors: Kyl W. Scott, Murphy; James M. Skidmore, Dallas, both of Tex.

[73] Assignee: Texas Instruments Incorporated, Dallas, Tex.

[21] Appl. No.: 08/821,141

[22] Filed: Mar. 20, 1997

Related U.S. Application Data

[62] Division of application No. 08/332,237, Oct. 31, 1994, Pat. No. 5,748,497.

[51] Int. Cl.[7] .................................................. G01R 31/38
[52] U.S. Cl. ................................... 371/22.31; 371/22.32; 371/22.5
[58] Field of Search ............................ 371/22.31, 22.32, 371/22.34, 22.5, 22.6, 27.1; 324/158.1; 702/181; 395/183.06

[56] References Cited

U.S. PATENT DOCUMENTS

| | | | |
|---|---|---|---|
| 4,012,625 | 3/1977 | Bowen et al. | 371/22.6 |
| 4,924,179 | 5/1990 | Sherman | 324/158 F |
| 4,937,765 | 6/1990 | Shupe et al. | 364/570 |
| 5,065,090 | 11/1991 | Cheewala | 324/158 R |
| 5,230,000 | 7/1993 | Mozingo et al. | 371/22.4 |
| 5,291,495 | 3/1994 | Udell, Jr. | 371/22.3 |
| 5,293,323 | 3/1994 | Doskocil et al. | 364/551.01 |
| 5,379,303 | 1/1995 | Levitt | 371/27.1 |
| 5,390,193 | 2/1995 | Millman et al. | 371/27 |
| 5,450,414 | 9/1995 | Lin | 371/22.3 |
| 5,737,340 | 4/1998 | Tamarapalli et al. | 371/22.5 |
| 5,748,497 | 5/1998 | Scott et al. | 702/181 |

OTHER PUBLICATIONS

Wunderlich, H. And Hellebrand, S., "*The Pseudoexhaustive Test of Sequential Circuits,*" Jan. 1992, IEEE Transaction on Computer–Aided Design, vol. 11, No. 1, pp. 26–33.

Rajski, J. And Tyszer, J., "*On the Diagnostic Properties of Linear Feedback Shift Registers,*" Oct. 1991, IEEE Transaction on Computer–Aided Design of Integrated Circuits and Systems, vol. 10, No. 10, pp. 1316–1322.

Pradhan, M., O'Brien, E., and Lam, S., "*Circular BIST with Partial Scan,*" 1988 International Test Conference, Paper 35.1, pp. 719–729.

Pilarski, S., Krasniewski, A. And Kameda, T., "*Estimating Testing Effectiveness of the Circular Self–Test Path Technique,*" Oct. 1992, IEEE Transactions on Computer–Aided Design, vol. 11, No. 10, pp. 1301–1316.

Wilf, H.S., *Algorithms and Complexity,* Prentice–Hall, Inc., Englewood Cliffs, NJ, 1986, pp. 208–211.

*Primary Examiner*—Hoa T. Nguyen
*Attorney, Agent, or Firm*—Tammy L. Williams; David Denker; Richard L. Donaldson

[57] ABSTRACT

The present invention is a method and system which determine signal probability and transfer probability for each node in a netlist describing an electrical circuit; determine, using the signal probability and transfer probability, a fault detection probability for each node; and, using the fault detection probabilities, determine overall fault coverage of the electrical circuit described in the netlist. The method and system of the present invention then, using the fault coverage data, heuristically determine a set of testpoints to be inserted into the netlist which increase the overall fault coverage of the electrical circuit above a predetermined value.

19 Claims, 5 Drawing Sheets

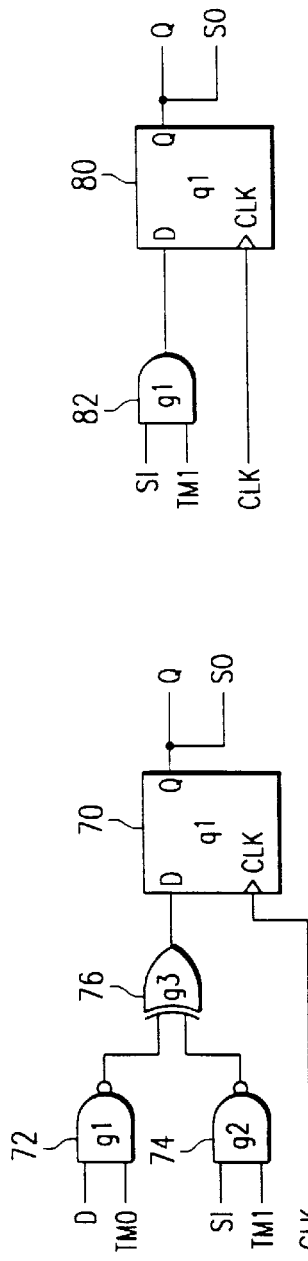
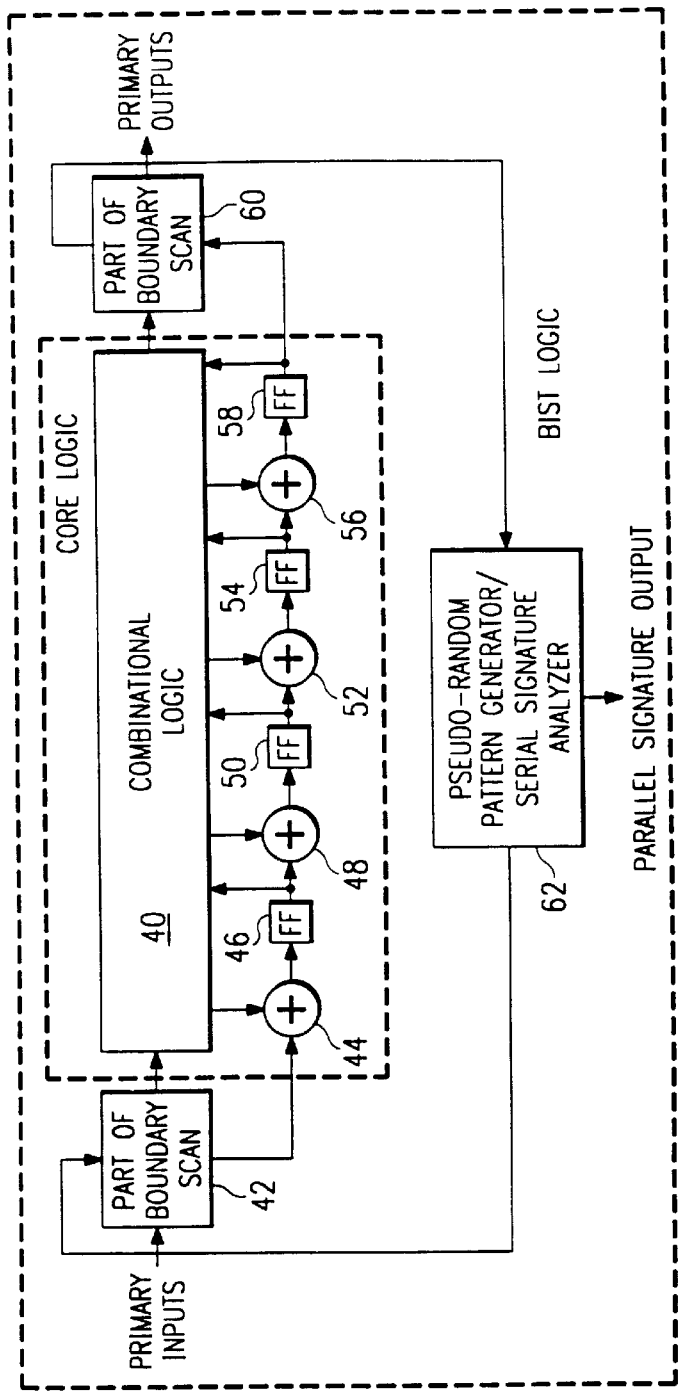

METHOD FOR IMPROVING FAULT COVERAGE OF AN ELECTRIC CIRCUIT

This is a division of application Ser. No. 08/322,237, filed Oct. 31, 1994 now U.S. Pat. No. 5,748,497.

NOTICE

Copyright© 1994 Texas Instruments Incorporated

A portion of the disclosure of this patent document contains material which is subject to copyright protection. The copyright owner has no objection to the facsimile reproduction by anyone of the patent document or the patent disclosure, as it appears in the United States Patent and Trademark Office patent file or records, but otherwise reserves all copyright rights whatsoever.

TECHNICAL FIELD OF THE INVENTION

The present invention relates to an automated method and system for improving fault coverage of an electrical circuit.

BACKGROUND OF THE INVENTION

With the increasing use of large digital application specific integrated circuits (ASICs), built-in-self-test (BIST) is becoming a preferred method for meeting stringent testability, fault-detection, and fault-isolation requirements. BIST reduces external automatic test equipment complexity by moving many of the external testing functions onto the chip itself. The penalty paid for BIST is extra silicon area overhead and circuit speed degradation.

One of the more effective and efficient self-test methodologies for digital circuit designs is known as circular built-in-self-test, or CBIST. CBIST is a structural self-test technique which is based upon the use of a scan-path to apply pseudo-random pattern stimulus to the circuit-under-test and to observe and compress its response.

What is needed is an automated method for selecting and inserting testpoints into a netlist describing an electrical circuit which brings fault coverage for a CBIST self-test to a predetermined level.

SUMMARY OF THE INVENTION

The present invention is a computer implemented system and method for selecting and inserting testpoints into a netlist describing an electrical circuit to bring fault coverage of the electrical circuit to a predetermined level.

The present invention reads a netlist file (or files) which describes the circuit to be analyzed, calculates the signal probability and transfer probability for every node (net) in the circuit, and from these probabilities calculates the fault detection probabilities for every fault origin in the circuit, calculates from the fault detection probabilities a statistical fault coverage for the circuit, and heuristically determines a set of testpoints which may be inserted into the circuit in order to bring its fault coverage to a desired value.

BRIEF DESCRIPTION OF THE DRAWINGS

For a better understanding of the present invention, reference may be made to the accompanying drawings, in which:

FIG. 2 illustrates a typical CBIST Architecture.

FIG. 3 illustrates an exemplary CBIST Scan-Cell;

FIG. 4 shows an exemplary Dummy Scan-Cell;

DETAILED DESCRIPTION OF THE INVENTION

As shown in FIG. 1, the CBIST Analysis Tool (CBA) 20 of the present invention is a computer-aided-engineering (CAE) tool specifically intended to aid IC designers and test engineers in the implementation of the circular built-in self-test (CBIST) methodology into digital circuit designs. The tool automates several of the tasks required for insertion of CBIST into a circuit, including: register-adjacency circuit analysis; scan-path insertion; probabilistic fault grade estimation; and testpoint insertion for fault grade improvement.

The CBA tool 20 uses the Mentor Graphics Corporation (MGC) Netlist Processor tool (part of the Explorer™ tool suite), and is written in the GENIE™ control language (refer to the GENIE™ *Users Guide and Netlist Processor Users and Reference Manual*, both products of MGC, for complete details about the GENIE™ command language and Netlist Processor tool). The CBA tool 20 executes on any host system on which the Netlist Processor tool executes (e.g., a Sun SPARCstation™, a product and trademark of Sun Microsystems, or an HP Apollo™ workstation, a product and trademark of Apollo Computer, Inc., a subsidiary of Hewlett Packard Company, etc.).

The CBA tool 20 can be used in either automatic or interactive mode. In automatic mode, the operation of the CBA tool 20 is controlled exclusively by command line option switches and processing is performed without any further user input. In interactive mode, the CBA tool 20 does not automatically perform any processing, but is controlled completely by user commands entered at the GENIE command interface.

Figure 1A:
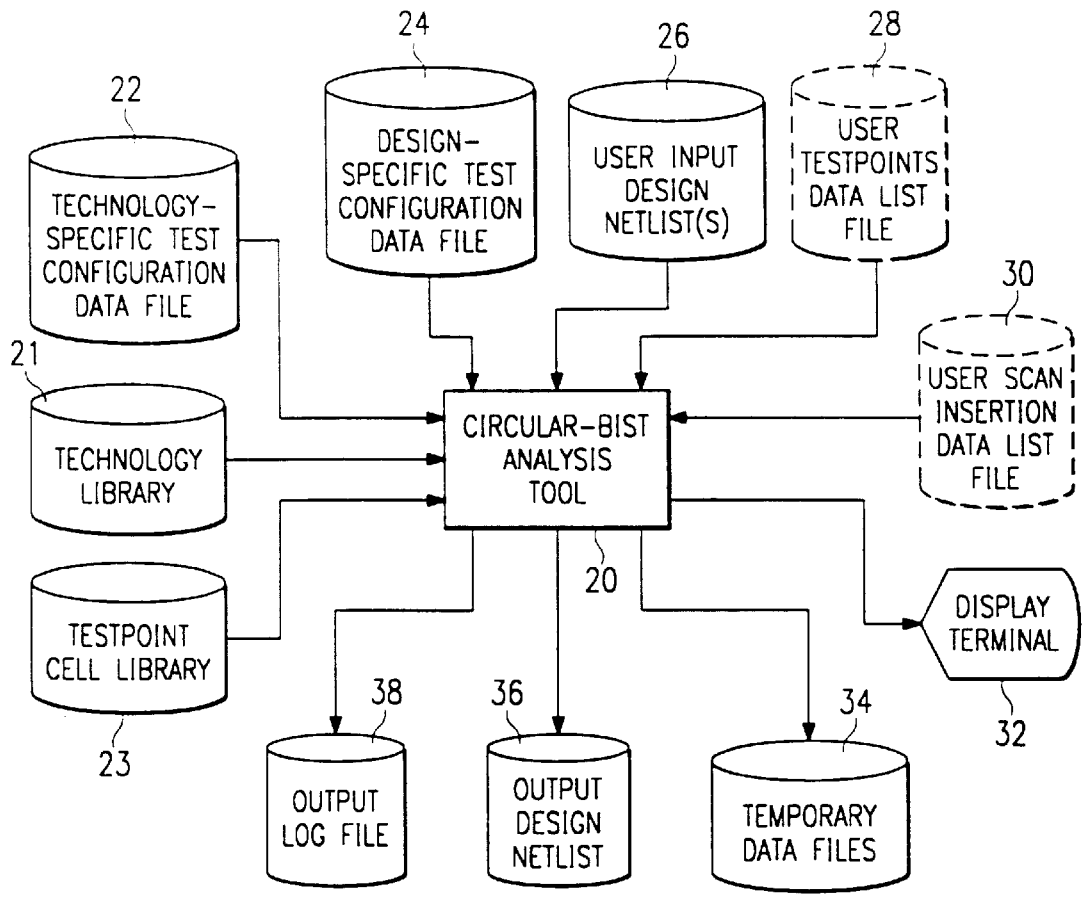
FIG. 1A shows the inputs and outputs associated with the system of the present invention.

As shown in FIG. 1A, the input and output data files for the CBA tool 20 are as follows.

A Technology Library 21 which describes all of the primitive logic gates or cells that are used in the digital circuit design;

A User Input Design Netlist(s) 26 which includes circuit design cells that describe the digital circuit that is to be analyzed and modified by the CBA tool 20. The CBA tool 20 can read netlists 26 in EDIF, NDL, TDL, GFL, or NP format. The circuit design cells are described in terms of the primitive cells included in the technology library 21.

A Technology Specific Test Configuration Data File 22 is also included in the CBA tool 20. The Technology specific Test Configuration Data File 22 includes test configuration data which is specific to the technology type. This data includes lists of buffers, inverters, flip-flops, and other gate types required by the CBA tool 20, certain pin-name information for these gates, etc., and also defines the transfer functions for each primitive combinational logic gate required for calculation of signal and transfer probabilities.

A Design Specific Test Configuration Data File 24 includes test configuration data which is specific to the user's circuit design. This data includes design specific port names, required fault detection coverage values, input signal initialization values, the number of BIST clock cycles, and other information required by the CBA tool 20 in order to correctly analyze and manipulate the circuit described in the netlist 26.

A Testpoint Cell Library 21 includes netlist descriptions of all testpoint cell types, discussed hereinbelow, which may be used by the CBA tool 20 during testpoint insertion. The testpoint cells are described in terms of the primitive cells (gates) included in the technology library 21.

A User Testpoints Data List File 28, which is optional, describes a set of testpoints generated by the user which are to be inserted by the CBA tool 20 into the circuit netlist 26.

A User Scan Insertion Data List File 30, also optional, lists the circuit elements to be linked into a scan-path to be inserted by the CBA tool 20 into the circuit netlist 26.

An Output Log File 38, optional, includes a log of all display terminal 32 output from the CBA tool 20.

A Temporary Data File 34 which, during execution of the CBA tool 20, stores temporary data files created in a current working directory.

An Output Design Netlist 36, which includes a modified version of the netlist 26 incorporating the CBIST test structures added by the CBA tool 20.

Figure 1B:
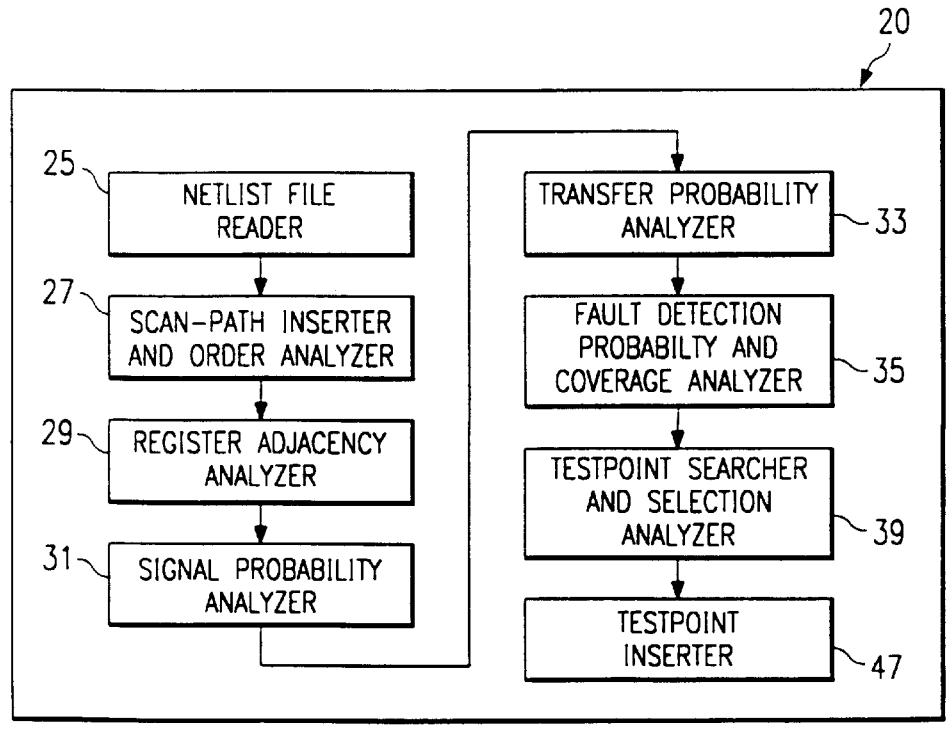
FIG. 1B depicts a detailed block diagram of the system of the present invention.

FIG. 1B is a generalized flowchart of one embodiment of the CBA tool 20 of the present invention. As shown in FIG. 1B, the CBA tool 20 includes a netlist file reader 25 which reads the netlist 26 data generated using the MGC Netlist Processor tool. The CBA tool 20 also includes a scan-path inserter and order analyzer 27, a register adjacency analyzer 29, a signal probability analyzer 31, a transfer probability analyzer 33, a fault detection probability and coverage analyzer 35, a testpoint searcher and selection analyzer 39 and a testpoint inserter 47. Each of these components of the CBA tool 20 of the present invention are discussed in more detail hereinbelow.

A typical CBIST architecture for a digital logic circuit is shown in FIG. 2. In the CBIST architecture, the circuit-under-test is abstractly partitioned into combinational logic 40 and sequential (or storage) elements 46, 50, 54, and 58. All, or a selected subset, of the circuit sequential logic elements 46, 50, 54, and 58 are linked (using additional test logic) in a circular scan-path. The inputs to the combinational logic 40 include the original circuit primary-inputs and the outputs from the scan-path cells (pseudo-primary-inputs). The outputs of the combinational logic 40 include the original circuit primary-outputs and the inputs to the scan-path cells (pseudo-primary-outputs).

Each cell of the scan-path has gating at 44, 48, 52, and 56 to exclusive-OR the normal circuit output data with the data from the previous cell in the scan-path, so that, during test, the scan-path forms a large non-linear feedback multi-input shift register. This mechanism is employed to simultaneously generate stimulus to the circuit inputs, and to observe and compress the circuit outputs. For circuits of non-trivial size, the CBIST scan-path will generate essentially random patterns.

In a full-scan design, all storage elements 46, 50, 54, and 58 are made scannable and included in the scan-path. However, due to area or performance constraints, it may not be acceptable to make all of the storage elements 46, 50, 54, nd 58 in a design scannable. In this case, a partial-scan design may be a viable solution. A partial-scan design can have acceptable testability characteristics (e.g., area/performance overhead and fault coverage) with proper selection of the storage elements 46, 50, 54, and 58 to be made scannable.

As shown in FIG. 2, a boundary-scan ring is typically included in the circular scan-path so as to provide pseudo-random stimulus 62 to the circuit primary-inputs, and to observe and compress the circuit primary-outputs during self-test. An IEEE-1149.1 Joint Test Action Group (JTAG) compliant boundary-scan ring, with the necessary modifications to perform the CBIST functions during self-test, may be used to for this purpose. The CBIST controller may also be linked to the JTAG test-access-port (TAP) controller so that self-test may be initiated via the JTAG bus.

The user must provide both the CBIST controller and boundary-scan circuits. The CBA tool 20 does not provide nor create these circuits, nor is it intended to be used to modify a boundary-scan ring circuit. The CBA tool 20 is intended to be used to analyze and modify only the core logic of an IC design.

The CBIST methodology also allows for the insertion of additional scan cells, or testpoints, into the circuitry, beyond the original storage elements 46, 50, 54, and 58, in order to increase the fault-detection coverage of the self-test. During test, these testpoints provide improved controllability and observability for those nodes of the circuit which would otherwise have poor fault-detection characteristics.

In a CBIST self-test typical scenario, the scan-path is loaded with some known pattern (e.g., all zeroes) at the beginning of the self-test. The scan-path is then clocked for some specified number of cycles in order to apply stimulus to the circuit and to compress the responses. At the completion of the self-test, the value remaining in the scan-path (or a portion of it) constitutes the test signature, which is shifted out and compared to a predetermined expected value. An additional pseudo-random-pattern generating linear-feedback shift-register (LFSR) 62 may be included in the scan-path, as shown FIG. 2, in order to ensure that the scan-path generates random signals, and to hold the test output signature.

Some advantages of the CBIST methodology, compared to other self-test methods, include simple control circuitry, lower gate overhead, it allows a partial-scan implementation, high fault-detection coverage (typically above 90%) without additional testpoints, and it allows use of testpoints to increase fault-detection coverage if required.

Disadvantages of the CBIST methodology include the potential for pattern looping, register-adjacency analysis is required for scan-path insertion, and fault simulation is required to verify fault-detection coverage.

Pattern looping and register-adjacency reduce the effectiveness of the self-test by reducing the randomness of the patterns generated by the scan-path or increasing the likelihood of fault masking due to compaction aliasing.

Pattern looping is a phenomenon where the scan-path begins to repeat its generated pattern after a small number of clock cycles, and is difficult to predict by circuit analysis. It becomes less likely to occur for large circuits, and its likelihood may be reduced or eliminated by the inclusion of a pseudo-random-pattern generating LFSR in the circular scan-path.

Register-adjacency is a phenomenon which is related to the exclusive-OR function within the CBIST scan-cells. Register-adjacency may be eliminated by proper ordering of the scan-path, or by the inclusion of extra dummy scan-cells. (See the paragraph entitled 'Register Adjacency' hereinbelow for a more detailed discussion of this topic.)

The CBIST scan-path consists of individual scan cells linked together in a circular chain. A scan cell can be a normal CBIST scan-cell (derived from a circuit storage element), a dummy scan-cell, or a testpoint cell. The operation of each of these cells is described below.

In the CBIST self-test methodology, some or all of the sequential logic elements, 46, 50, 54, and 58 in FIG. 2, (i.e., flip-flops, latches, etc.) of the circuit are replaced by CBIST scan-cells. The CBIST scan-cell incorporates the original circuit storage element 46, 50, 54, and 58 as well as the required test logic to allow the CBIST scan-cell to be controlled properly during test, as in the example scan-cell shown in FIG. 3.

The CBIST scan-cell consists of a storage element 70, in this example a D-type flip-flop (q1), and additional test logic (gates g1 72, g2 74, and g3 76) which allow the scan-cell to operate in one of four modes, determined by the test control inputs TM0 and TM1.

All operations are synchronous with respect to the CLK input. Any given implementation of the test logic gating for a scan-cell need not necessarily be as shown in FIG. 3, but must be functionally and logically equivalent (e.g., the NAND gates g1 72 and g2 74 could be AND gates). The Q output of the scan-cell storage element serves as both the normal data output and as the shift data output of the scan-cell.

A dummy scan-cell, as shown in FIG. 4, unlike a normal scan-cell, shown in FIG. 3, serves only as a scan shift element during test (i.e., it has no D input or Q output) and is typically used to eliminate register-adjacency in the scan-path. The dummy scan-cell in FIG. 4 includes a storage element 80 and logic g1 82 to allow it to be controlled properly during test.

The SI, SO, TM1, and CLK ports serve the same functions as for the normal scan-cell shown in FIG. 3. Operation of the dummy scan-cell in FIG. 4 is controlled by the TM1 test control input.

In the CLEAR or NORMAL mode, TM1=0, the dummy scan-cell in FIG. 4 loads a logic 0. In the SCAN or BIST mode, TM1=1, the dummy scan-cell operates as a scan shift element, capturing data from the SI input. All operations are synchronous with respect to the CLK input. Any given implementation of the test logic gating for the dummy scan-cell in FIG. 4 need not necessarily be as shown, but must be functionally and logically equivalent.

Figure 5:
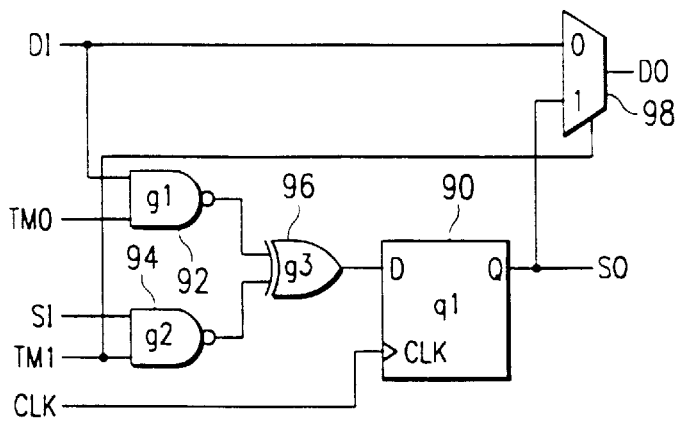
FIG. 5 depicts an exemplary Testpoint Cell.

A testpoint cell, as shown in FIG. 5, is an additional test logic structure which is inserted into the circuit in order to increase the fault-detection coverage of the CBIST self-test.

Testpoint cells, such as that shown in FIG. 5, may be added to the circuit described in the netlist 26 in order to increase the observability, controllability, or both, of particular areas or nodes of the circuit. A testpoint cell, FIG. 5, incorporates the required logic to allow the cell to be controlled properly during test.

The SI, SO, TM0, TM1 and CLK ports serve the same functions as for the normal scan-cell, shown in FIG. 3. A testpoint cell, FIG. 5, may also have an optional reset input for asynchronously resetting the storage element 90 in the example testpoint cell shown in FIG. 5. Operation of the example testpoint cell shown in FIG. 5 is controlled by the TM0 and TM1 test control inputs.

This testpoint cell, FIG. 5, is inserted into the circuit netlist 26 such that a given node of the circuit can be observed and controlled during test. All gate outputs which were connected to the original node are connected to the DI input of the testpoint cell, FIG. 5, and all gate inputs which were connected to the original node are connected to the DO output of the testpoint cell, FIG. 5. During normal operation of the circuit, the signal at the DI input is routed to the DO output, so that the circuit functions normally, with only the additional delay due to the testpoint cell logic. During test, however, the signal at the DO output is a pseudo-random pattern controlled by the testpoint cell, FIG. 5. The signal at the DI input is observed and compressed by the testpoint cell, FIG. 5, by exclusive-OR'ing it with the scan shift data at the SI input.

The current embodiment of the CBA tool 20 implements six testpoint types: a registered control-and-observe testpoint, a registered observe-only testpoint, a dummy scan-cell testpoint, a non-registered control-and-observe testpoint, a non-registered observe only testpoint, a registered observe-only testpoint and a non-registered control-only testpoint.

The testpoint cell shown in FIG. 5, described above, is an example of one possible configuration for an observe-and-control type cell. Examples of other possible testpoint cell types are shown in FIGS. 6–10.

Figure 6:
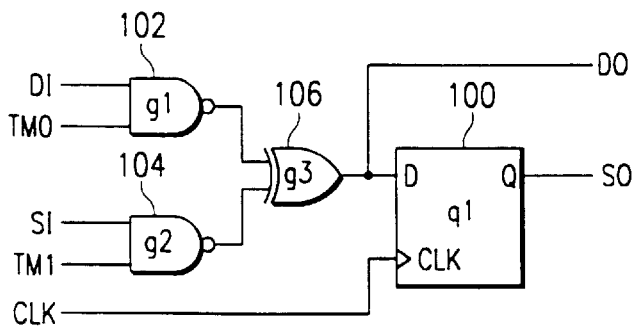
FIG. 6 shows an exemplary Registered Observe-And-Control Testpoint Cell.

The testpoint cell shown in FIG. 6 is an example of another possible configuration for an observe-and-control type cell. It functions similarly to the testpoint cell shown in FIG. 5, but has a lower gate overhead. During NORMAL mode operation, the DO output tracks the DI input. During SCAN mode operation, the DO output tracks the SI input, and the cell acts as a simple shift element. During BIST mode operation, the DO output is the exclusive-OR of the SI and DI inputs. If the SI input signal is random, and the DI and SI inputs are independent, then the DO output will also be random.

Figure 7:
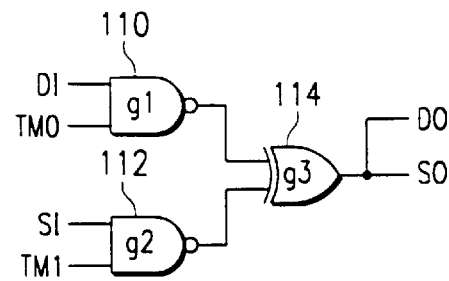
FIG. 7 shows an exemplary Non-Registered Observe-And-Control Testpoint Cell.

The testpoint cell shown in FIG. 7 is an example of another possible configuration for an observe-and-control type cell. This cell, however, does not include a storage element, and is intended to be used in conjunction with a registered scan-cell or testpoint cell, as shown in FIG. 8.

Figure 8:
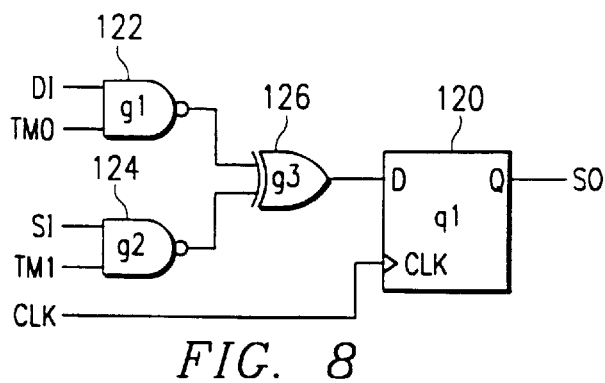
FIG. 8 illustrates an exemplary Registered Observe-Only Testpoint Cell.

The testpoint cell shown in FIG. 8 is an example of a registered observe-only type cell. It is similar to the observe-and-control type cell shown in FIG. 6, but does not have a DO output. The cell type in FIG. 8 may be used to observe circuit nodes which have poor observability but adequate controllability/toggling characteristics.

Figure 9:
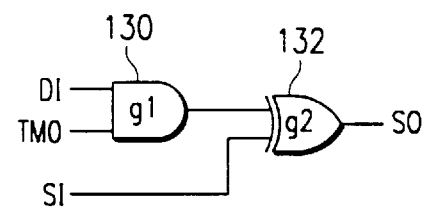
FIG. 9 shows an exemplary Non-Registered Observe-Only Testpoint Cell.

The testpoint cell shown in FIG. 9 is an example of another possible configuration for an observe-only type cell. The cell in FIG. 9, however, does not include a storage element, and is intended to be used in conjunction with a registered scan-cell or testpoint cell which follows it. Note that the cell shown in FIG. 9 does not have AND gating on the SI input; this is unnecessary since this cell does not include a storage register, and any subsequent registered scan-cell or testpoint cell will have this gating.

Figure 10:
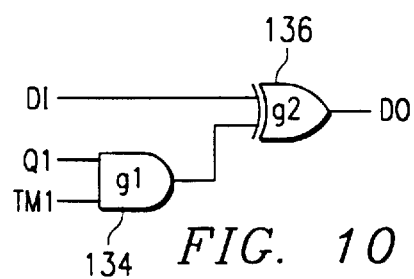
FIG. 10 illustrates an exemplary Non-Registered Control-Only Testpoint Cell.

The testpoint cell shown in FIG. 10 is an example of a control-only type cell. The cell type in FIG. 10 may be used to control circuit nodes which have poor controllability/ toggling but adequate observability characteristics. The cell type shown in FIG. 10 may also be used in conjunction with an observe-only type cell to produce an observe-and-control testpoint cell. The cell type in FIG. 10 is intended to be used in conjunction with another registered scan-cell or testpoint cell, with the QI input of the cell shown in FIG. 10 being connected to the SO output of the other cell.

Register-Adjacency

In the CBIST self-test methodology, the data sampled by each scan-cell during test is the exclusive-OR of the normal data (D input) and the scan shift data (SI input) of the cell. If the signals at the D and SI inputs are independent, and the signal at the SI input is random, then the sampled data will also be a random pattern, and the output of the cell will be an independent random pattern (a random pattern which is shifted by one or more bits is an independent, distinct, random pattern). If, however, the signals at the D and SI inputs of the scan-cell are not independent, then the randomness of the cell's output data pattern may be reduced. Moreover, a fault which occurs in the D input logic cone may also affect the SI input, resulting in fault masking. This situation is referred to as unit-distance register-adjacency, and it may reduce the effectiveness of the CBIST self-test. Thus, the CBA tool 20 of the present invention includes the register adjacency analyzer 29, which tests the circuit-under-test as described in the netlist 26 for unit-distance register adjacency.

For any given scan-cell, the scan-cell is defined to be first-order register-adjacent to its preceding scan-cell if the fanin signal set (the set of signal sources which affect a given signal) of the SI input intersects the fanin signal set of the D input. This definition of register-adjacency may be expressed mathematically as $$[F_{SI} \cap F_D \neq \emptyset] \rightarrow \text{register-adjacency} \quad (1)$$

where $F_D$ is the set of signals which are in the fanin of the D input of the scan-cell, and $F_{SI}$ is the set of signals which are in the fanin of the SI input of the scan-cell.

The fanin signal set of the SI input can include multiple signals if, for example, one or more non-registered testpoints, as shown in FIGS. 7, 9, and 10, are inserted into the scan-path before a normal registered scan-cell.

If no non-registered testpoints precede a scan-cell, then the fanin signal set of the SI input is a single signal (i.e., it consists only of the output of the preceding scan-cell). In this case, first-order register-adjacency occurs if this signal a member of the fanin signal set of the D input. This is expressed mathematically as $$[s_{SI} \epsilon F_D] \rightarrow \text{register-adjacency} \quad (2)$$

where $s_{SI}$ is the source signal which drives the SI input of the scan cell. In this case, expression (2) is equivalent to (1).

Figure 11:
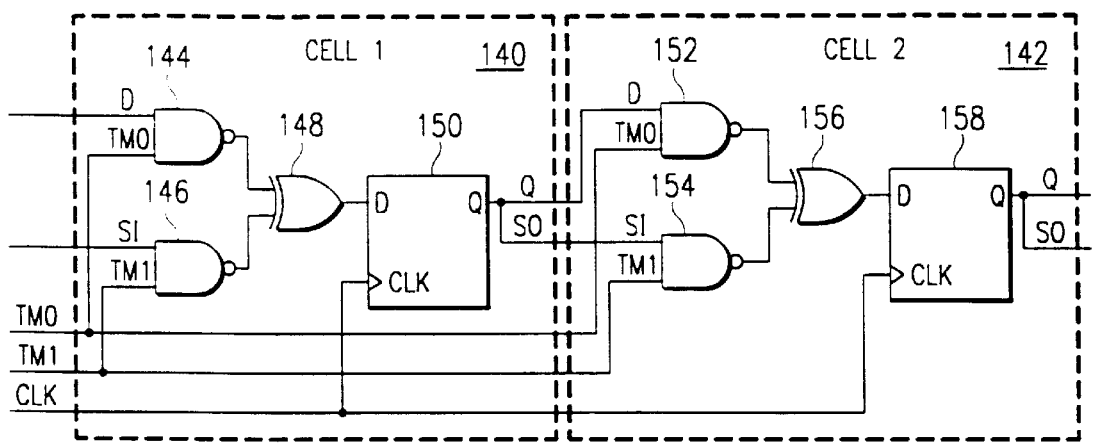
FIG. 11 depicts an example of Register-Adjacency.

A simple example of register-adjacency is the case of a shift-register, as illustrated in FIG. 11.

In the example shown in FIG. 11, it is easily shown that the output of CELL 2 142 is always a logic 0 during test. Although this is an extreme example, the principle applies even if there is some combinational gating between the Q output of one cell and the D input of the next. The particular case of register-adjacency illustrated in the example shown in FIG. 11 may be corrected by simply changing the scan order (from CELL 2 142 to CELL 1 140). However, not all instances of register-adjacency may be eliminated by re-ordering the scan chain; it may be necessary, in some cases, to insert dummy scan-cells in the scan chain in order to eliminate register-adjacency.

Scan-Path Ordering

The CBA tool 20 also provides a scan path inserter and order analyzer 27 for insertion of a CBIST scan-path into a circuit netlist 26 if no path already exists. The user may specify the storage elements to be included in the scan-path, or the user can allow the CBA tool 20 to select the storage elements automatically, in which case, all storage elements in the circuit that can be made scannable will be included in the scan-path (i.e., it will be full-scan). In either case, the scan path inserter and order analyzer 27 of the CBA tool 20 will order the scan-cells, and insert dummy scan-cells as needed, so as to eliminate any register-adjacency in the scan-path (unless re-ordering is specifically disabled by the user).

The scan-cell ordering algorithm employed by the scan path inserter and order analyzer 27 of the CBA tool 20 takes into account the hierarchy of the circuit netlist 26 so that at most only one scan-path traverses any hierarchical block of the netlist 26.

The problem of finding a single non-register-adjacent CBIST scan-path ordering through a circuit is analogous to the problem of finding a Hamilton path through a directed graph. (A Hamilton path passes through every vertex of a graph exactly once.) The vertices of the graph correspond to the scannable elements of the circuit, and the edges of the graph correspond to all the possible valid-next-scan-paths for each of the scannable elements. For a given scannable element, a valid-next-scan-path exists from that element to a second element if the second element does not appear in the fanout cone of the first (or conversely, if the first element does not appear in the fanin cone of the second).

It is known that the Hamilton path problem is NP-complete, which implies that finding a valid scan ordering (or determining that none exists) for some large circuits may not be possible within a reasonable time. However, it has been shown that a graph that has >c·n log n edges, where n is the number of vertices of the graph and c is a constant, is very likely to have a Hamilton path (see the textbook by Wilf, H. S., *Algorighms and Complexity*, Prentice-Hall, Inc., Englewood Cliffs, N.Y., 1986, pp. 208–211).

This fact can be used to limit the number of iterations of the path search algorithm, so that the algorithm will terminate the search for a valid scan ordering after a certain number of iterations, insert a dummy scan element into the ordering, and then retry the search.

A formal statement of the algorithm implemented by the scan-path inserter and order analyzer 27 for finding a valid scan ordering for a CBIST scan-path through a given netlist 26 is given below in the nrap and dhp procedures.

--- procedure nrap (*NL* : netlist);
{
    Non-Register-Adjacent-Path - Find a non-register-adjacent scan-path *P* through netlist *NL*. Return path *P*, if it exists, or an empty path otherwise.
}
    {construct graph *G* }
    *G* := ∅;
    *numvertices* := 0;
{
    a scannable element is a primitive storage element which is to be -continued

```
        converted to a scan-cell, or is a hierarchical sub-block which includes
        primitive scannable elements
  }
        for each scannable element v in NL to be included in the scan-path
        do
            if v is a hierarchical sub-block then
                { construct a scan-path through v }
                nl := netlist for sub-block v;
                call nrap (nl);
            end; { if v }
            add v to G;
            numvertices := numvertices + 1;
        end ; { for v }
        for each scannable element v in NL do
            if v is a hierarchical sub-block then
                P_v := scan-path through v;
                v' := last primitive element in P_v;
                F_o := fanout signal set for v';
            else
                F_o := fanout signal set for v;
            end; { if v }
            for each scannable element w in NL do
                if w is a hierarchical sub-block then
                    P_w := scan-path through w;
                    w' := first primitive element in P_w;
                    if w' ∉ F_o then
                        add edge e(v,w) to G;
                    end ; { if w' }
                else
                    if w ∉ F_o then
                        add edge e(v,w) to G;
                    end; { if w }
                end; { if w }
            end; { for w }
        end; { for v }
        repeat
            maxtries := 2 · numvertices · log (numvertices + 1);
            P := call dhp (G, ∅);
            if P = ∅ then
                add dummy vertex d to G;
                numvertices := numvertices + 1;
                for each vertex v in G, v ≠ d do
                    add edge e(d,v) to G;
                    add edge e(d,v) to G;
                end; { for v }
            end; { if P }
        until P ≠ ∅;
        return P;
  end. { procedure nrap }
  procedure dhp (G : graph; P : path);
  {
        Directed Hamilton Path - appends next vertex to Hamilton path P
        through graph G. Returns completed Hamilton path if it exists, or
        empty path otherwise. If maximum number of iterations reached,
        returns empty path.
  }
        for each vertex v in G do
            if v ∉ P then
                if P ≠ ∅ then
                    w := head of path P;
                end; { if P }
                if P = ∅ or edge e(w,v) exists then
                    P_t := P ∪ {v};
                    if P_t includes every vertex in G then return P_t;
                    { maxtries is global to this procedure }
                    if maxtries = 0 then return ∅;
                    maxtries := maxtries - 1;
                    P_t := call dhp (G, P_t);
                    if P_t ≠ ∅ then return P_t;
                end; { if e }
            end; { if v }
        end; { for v }
        return ∅;
  end. { procedure dhp }
```

The nrap procedure constructs an appropriate graph from the given hierarchical netlist 26, and then calls the dhp procedure to construct a Hamilton path through the graph. The dhp procedure is a recursive procedure which generates the path by adjoining a new vertex to the head of the path each time it is called. If dhp can not find a Hamilton path after a certain number of iterations, nrap inserts a dummy scan element into the graph and calls dhp again. This continues until a valid path is found.

Fault Detection Analysis and Estimation

The primary purpose of the CBIST self-test is, of course, to detect faults in the circuit-under-test as described in the netlist 26. The CBA tool 20 provides a means to estimate the effectiveness of the self-test through analysis of the circuit described in the netlist 26.

The fault model for the CBA tool's 20 fault detection analysis is the commonly used stuck-at-0/1 logic gate fault model. The fault universe consists of all stuck-at-0/1 faults on nets (node faults), gate inputs (input pin faults), and gate outputs (output pin faults) of the circuit-under-test. In a typical ASIC design, the circuit-under-test would be the core logic of the circuit or IC, including any core logic CBIST circuitry, but excluding non-core logic circuitry, such as a boundary-scan ring, JTAG TAP circuitry, I/O pad buffers and drivers, or self-test control circuitry.

For a given fault to be detected, the fault origin must be exercised, by some combination of circuit inputs, to the opposite state from the stuck-at fault, and the signal at the fault origin must be propagated to the circuit outputs (i.e., a change in state of the signal will cause a change in state of at least one output). The fault detection coverage, or fault grade, of the self-test (the percentage of all detectable faults which are detected) can be determined precisely by a fault simulation of the circuit, and there are a number of commercially available tools and simulators for this purpose. Unfortunately, a complete fault simulation of even a small circuit can be very time consuming.

The CBA tool 20, however, produces a probabilistic estimate of the fault grade through analysis of the circuit topology. The calculation of the fault grade estimate is premised upon the assumption that random binary signals are present at the circuit primary inputs and at the outputs of the circuit storage elements (a generally valid assumption for the CBIST methodology), and is implemented, in one embodiment of the present invention, using the signal probability analyzer 39, the transfer probability analyzer 33 and the fault detection and coverage analyzer 35, discussed hereinbelow.

Signal Probability

The signal probability analyzer 31 determines the signal probability for a node included in the netlist 26 describing the circuit-under-test. The signal probability for a node is defined to be the probability of a logic 1 appearing on that node during any single clock cycle of the self-test. By definition, if $P_s(N)$ is the signal probability for some node N, then $(1-P_s(N))$ is the probability of a logic 0 appearing on node N. A random signal has a signal probability of ½ (i.e., it is equally likely that the signal will be a logic 0 as it is to be a logic 1). Unless otherwise specified, a primary-input to the circuit is assumed to be a random signal and is assigned a signal probability of ½. The output of a cell in the CBIST scan-path (a pseudo-primary-input) is also assumed to be a random signal, and is likewise assigned a signal probability of ½.

For a typical net with a single output driver, and one or more gate input connections, the signal probabilities at the output pin, the net, and the input pins are identical. However, for a net with multiple drivers, such as a tri-state bus, the CBA tool 20 uses a wired-AND model to calculate the signal probability for the net. In this model, a tri-stateable output is assumed to be in the logic 1 state if it is not explicitly in the logic 0 state, and the signal probability of the net is, therefore, the product of the signal probabilities of the output pins which drive it. The signal probability for a gate input pin is the same as that for the net to which it is connected.

Figure 12:
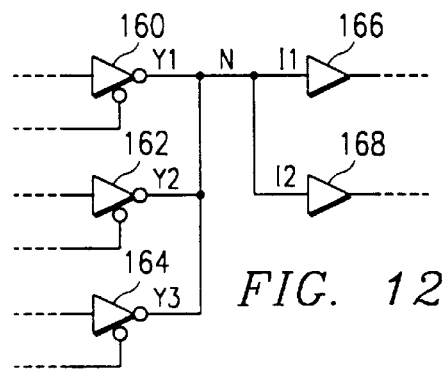
FIG. 12 illustrates signal probability propagation.

This propagation of the signal probabilities from gate output pins, to a net, to gate input pins is illustrated in FIG. 12.

The propagation of signal probabilities across a logic gate is dependent upon the logic function of the gate. In general, the signal probability at the output of a logic gate is a function of the signal probabilities at the inputs of the logic gate (assuming that the signals are independent) and of the logic function of the gate:

$$P_s(Y) = F_s[\{P_s(I_n)\}, f_g] = F_s(g) \tag{3}$$

where $P_s(Y)$ is the signal probability at output Y, $P_s(I_n)$ is the signal probability at input $I_n$, $f_g$ is the logic function of gate g, and $F_s$ is the signal probability transfer function for gate g.

The signal probability transfer function $F_s$ for any arbitrary logic gate can be determined directly from the canonical form of the logic function for the gate. (A canonical form of a Boolean function is a sum-of-products expression in which all product terms are mutually exclusive, and can be easily derived from a Karnaugh map of the function with no overlapping cubes, or from a binary truth-table of the Boolean function.)

Figure 13A:
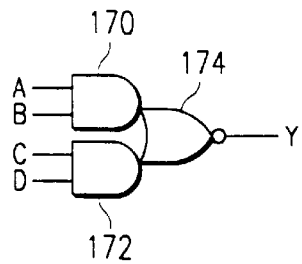
FIG. 13A shows an exemplary AND-OR-INVERT gate.

For example, consider the AND-OR-INVERT logic gate shown in FIG. 13A. One possible canonical form of the Boolean function for output Y is:

$$Y = \bar{A}\cdot B\cdot \bar{C}\cdot D + \bar{A}\cdot B\cdot \bar{D} + \bar{B}\cdot \bar{C}\cdot D + \bar{B}\cdot \bar{D}m. \tag{4}$$

Since all product terms of this expression are mutually exclusive (i.e., no two product terms may be true simultaneously), the probability that the output is true (a logic 1) is the sum of the probabilities of each product term being true. Thus, using a shorthand notation (where the signal probability value $P_s(X)$ is represented by x), the signal probability transfer function for Y is given by the following algebraic expression:

$$F_s(g) = y = (1-a)b(1-c)d + (1-a)b(1-d) + (1-b)(1-c)d + (1-b)(1-d) \tag{5}$$

which reduces to $$F_s(g) = y = 1 - ab - cd + abcd. \tag{6}$$

Expression (5) is the same as expression (4) with each non-inverted Boolean variable being replaced by its signal probability value (the probability of the signal being a logic 1), and each inverted Boolean variable being replaced by one less its signal probability value (the probability of the signal being a logic 0). For any logic function, the signal probability transfer function is always of degree 1 (i.e., the highest power for any variable is 1).

This same result could also have been obtained by considering the logic gate as a circuit of more primitive gates. For example, the AND-OR-INVERT logic gate shown in FIG. 13A could be redrawn as a circuit of AND, OR, and INVERTER gates shown in FIG. 14.

Working from inputs toward the output, the signal probability values for the intermediate signals E, F, and G, and for output Y can be determined using Table I. Table I gives the signal probability transfer functions for the basic one- and two-input Boolean logic gates.

TABLE I

Signal Probability Transfer Functions

| Gate Type | Logic Function | Signal Probability Transfer Function $P_s(Y) = F_s(g)$ |
|---|---|---|
| BUFFER | $Y = A$ | $F_s(g) = P_s(A)$ |
| INVERTER | $Y = \bar{A}$ | $F_s(g) = 1 - P_s(A)$ |
| AND | $Y = A \cdot B$ | $F_s(g) = P_s(A) \cdot P_s(B)$ |
| NAND | $Y = \overline{A\cdot B} = \bar{A}\cdot B + \bar{B}$ | $F_s(g) = 1 - P_s(A) \cdot P_s(B)$ |
| OR | $Y = A + B = A \cdot \bar{B} + B$ | $F_s(g) = P_s(A) + P_s(B) - P_s(A) \cdot P_s(B)$ |
| NOR | $Y + \overline{A+B} = \bar{A}\cdot\bar{B}$ | $F_s(g) = 1 - P_s(A) - P_s(B) + P_s(A) \cdot P_s(B)$ |
| XOR | $Y = A \oplus B = (\bar{A}\cdot B) + (A\cdot\bar{B})$ | $F_s(g) = P_s(A) + P_s(B) - 2\cdot P_s(A)\cdot P_s(B)$ |
| XNOR | $Y = \overline{A \oplus B} = (A\cdot B) + (\overline{A\cdot B})$ | $F_s(g) = 1 - P_s(A) - P_s(B) + 2\cdot P_s(A)\cdot P_s(B)$ |

From the transfer function for an AND gate, $$e = ab, \tag{7}$$

$$f = cd, \tag{8}$$

from the transfer function for an OR gate, $$g = (e + f - ef) = (ab + cd - abcd), \tag{9}$$

and from the transfer function for an INVERTER, $$y = (1 - g) = (1 - ab - cd + abcd) \tag{10}$$

which matches the previous result given in (6).

The signal probability analyzer 31 of the CBA tool 20 uses this same methodology for computation of the signal probabilities throughout the circuit described in the netlist 26. In order to perform these calculations, the CBA tool 20 must be given the signal probability transfer functions for each primitive combinational logic gate type available in the technology library 21, or must be able to compute them from primitive generic logic models of the gate types (macro 15 definitions). The signal probability transfer functions shown in Table I are generally specified in the technology specific test configuration data file 22. If no transfer function is specified for a gate type, then a generic model for the gate type must be specified. Signal probability transfer functions for the generic logic primitives are predefined in a default test configuration data list.

Randomness of the CBIST Scan-Path Output

Consider the 2-input exclusive-OR (XOR) gate, which, from Table I, has a signal probability transfer function of $$P_s(Y)=F_s(g)=P_s(A)+P_s(B)-2 \cdot P_s(A) \cdot P_s(B)$$

or, using the shorthand notation, $$y=a+b-2ab. \tag{11}$$

An interesting property of this gate, which is relevant to the randomness characteristics of the stimulus generated by the CBIST scan-path, is that if one input of this gate has a signal probability of ½, and the inputs are independent, then the output also has a signal probability of ½, regardless of the signal probability at the other input. For example, let input A be a random signal, so that a=½, then $$y=½+b-2(½)b=½+b-b=½. \tag{12}$$

Obviously, the same result is obtained if input B is given a signal probability of ½. Since an XOR gate of more that 2 inputs may be redrawn as a series of 2-input XOR gates, it can be shown that this property applies to an XOR gate of any number of inputs.

Recall that each cell of the CBIST scan-path includes gating to perform an exclusive-OR of the SI and D inputs during test, and a storage element to hold the exclusive-OR output. Therefore, if the SI input to the a scan-cell is a random signal (i.e., it has a signal probability of ½), and the D input is independent of the SI input, then the SO (and Q) output of the scan-cell will also be a random signal. Furthermore, since the output of the scan-cell is delayed, it will be an independent random signal (i.e., for any given clock cycle, the signal at the SO output will be independent of the signal at the SI input).

In general, the D and SI inputs will be independent and uncorrelated if their fanin signal sets do not intersect, i.e., there is no unit-distance register-adjacency for the cell. However, in certain circumstances the signals may be correlated due to the phenomenon of second-order register-adjacency, in which two non-consecutive scan-cells have correlated outputs. This condition is sufficiently rare, however, that it is ignored by the CBA tool 20, and the D and SI inputs are assumed to be independent if no unit-distance register-adjacency exists for the cell.

Therefore, if the circular scan-path has no register-adjacency, and is at some point stimulated with a random (or pseudo-random) signal, such as by the inclusion of an LFSR 62 of sufficient size (such that it does not recycle during the duration of the self-test) in the scan-path, then each cell of the scan-path will produce a random, independent, signal at its output. ps Reconvergent Fanout The methods just discussed for the derivation of the signal probability transfer function for a logic gate assume that the input signals to the logic gate under consideration are independent. This is not true for circuits which have reconvergent fanout. As an example of reconvergent fanout, again consider the AND-OR-INVERT gate, as shown in FIG. 14, except with input D being tied to input A, as shown in FIG. 15A.

Figure 14:
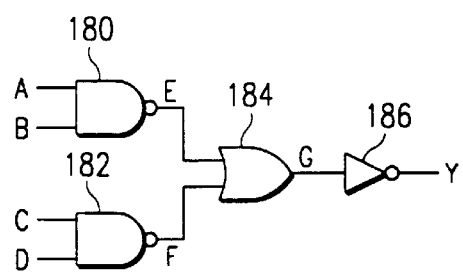
FIG. 14 illustrates a primitive circuit for an AND-OR-INVERT Gate.

Using the signal probability transfer function for the AND-OR-INVERT gate, shown in FIG. 14, as given in equation (6), and substituting a for d, we obtain $$y=1-ab-ac+a^2bc \tag{13}$$

which is incorrect. Note that this expression includes a variable term of degree 2.

Figure 15A:
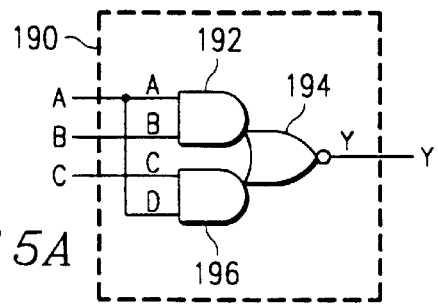
FIG. 15A shows an example of reconvergent fanout.
Figure 15B:
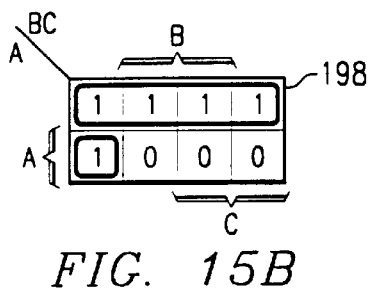
FIG. 15B shown a Karnaugh Map representing the reconvergent fanout FIG. 15A.

The correct transfer function for the circuit shown in FIG. 15A can be derived by considering the actual logic function of the circuit shown in FIG. 15A, which, in this case, is $$Y=\bar{A}*B+A*C \tag{14}$$

which has a canonical form of $$Y=\bar{A}+A \cdot \bar{B} \cdot \bar{C}. \tag{15}$$

The correct signal probability transfer function for this circuit, derived from the canonical form, is $$y=(1-a)+a(1-b)(1-c)=1-ab-ac+abc \tag{16}$$

Note that (16) can be derived from (13) by simply reducing all variable terms of degree greater than one to degree one. Indeed, the signal probability functions for the nodes of any arbitrarily complex combinational logic circuit could be determined is by this method of traversing the circuit from inputs toward outputs, computing the transfer functions for the primitive gates of the circuit in terms of the primary input variables, and reducing the degree of all variable terms to one.

However, this method requires that the algebraic expression for the signal probability of each signal in the circuit be computed and stored, as opposed to just simply computing the numerical value of the signal probability of each signal, and would also require an efficient method for analyzing and parsing algebraic expressions.

The CBA tool 20 ignores the effects of reconvergent fanout upon signal probability and only computes the numerical values of the signal probabilities as it traverses the netlist 26. When calculating the signal probability for any gate output, the CBA tool 20 assumes that all inputs to the gate are independent.

Transfer Probability

The transfer probability analyzer 33 determines the transfer probability of a node of the circuit-under-test described in the netlist 26. The transfer probability for a node is defined to be the probability of the signal on that node being propagated, or transferred, to a primary-output of the circuit, or to the input of a cell in the CBIST scan-path (a pseudo-primary-output), during any single clock cycle of the self-test. A signal is considered propagated to an output if a change in state of the signal would cause a change in state of the output. Unless otherwise specified, a node connected directly to a primary-output is defined to have a transfer probability of 1. Likewise, a pseudo-primary-output is defined to have a transfer probability of 1.

For computational ease, the transfer probability for a net is taken to be the greatest of the transfer probabilities at the gate input pins to which the net is connected. The transfer probability for a gate output pin is the same as that for the net to which it is connected. A floating net or unconnected gate output pin has a transfer probability of zero.

Figure 16:
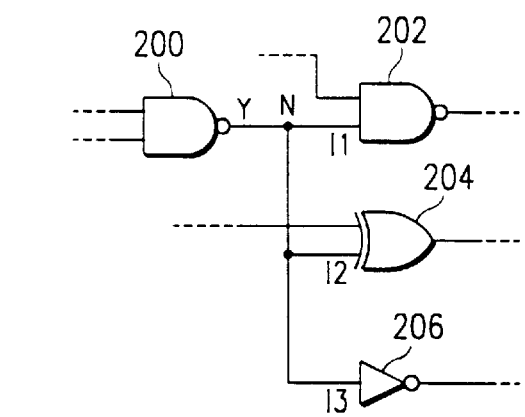
FIG. 16 illustrates transfer propability propagation.

This propagation of the transfer probabilities from gate input pins, to a net, to gate output pins is illustrated in FIG. 16.

The propagation of transfer probabilities across a logic gate is dependent upon the logic function of the gate. The transfer probability at the input of a logic gate is the product of the transfer probability at the output of the gate and a transfer function for the input:

$$P_t(I)=P_t(Y) \cdot F_t(I) \tag{17}$$

where $P_t(Y)$ is the transfer probability at output Y of gate g, $F_t(I)$ is the transfer probability transfer function for input I of gate g, and $P_t(I)$ is the transfer probability at input I. The transfer function $F_t(I)$ gives the probability that a change in state of input I causes a change in state of output Y, and is a function of the logic function of the gate and the signal probabilities at the inputs of the gate (other than input I):

$$F_t(I_m)=f_t[\{P_T(I_n)\}, f_g]; \; n \neq m \tag{18}$$

$F_t(I)$ will generally be unique for each input of a multi-input gate.

For any arbitrary logic gate g, the change in state of output Y due to a change in state of input I is given by the partial derivative of the signal probability transfer function for Y with respect to the signal probability at I. This function is defined as $$F_s(I) = \frac{\partial F_s(g)}{\partial i} \tag{19}$$

Since the signal probability transfer function $F_s(g)$ is always of degree 1, $F_s'(I)$ is independent of i (i.e., it will never include the term i), and will always evaluate to either 1 (output Y changes in the same direction as input I), 0 (output Y does not change), or −1 (output Y changes in the opposite direction of input I) for any given state of inputs of the gate (i.e., when the input signal probabilities are evaluated at either 0 or 1). For any given state T of inputs (other than input I), the probability that the output Y will change state due to a change in state of input I is given by the product of the absolute value of $F_s'(I)$ and the probability that state T occurs. For an m-input gate, there are $2^{m−1}$ possible states T.

Since no two states can occur simultaneously (i.e., they are mutually exclusive), the sum of these products over all possible states T gives the total probability that output Y changes state due to a change in state of input I. This is, of course, the definition of $F_t(I)$. Thus, $$F_t(I) = \sum_{T=0}^{2^m-1} (P_T \cdot |F_s'(I)|_T|) \tag{20}$$

where $P_T$ is the probability that state vector T occurs, $F_s'(I)$ is the partial derivative of the signal probability transfer function for the gate with respect to the signal probability at input I, and $F_t(I)$ is the transfer probability transfer function for input I. The state probability, $P_T$, is calculated from the signal probability values for the variables in the state vector.

Figure 13B:
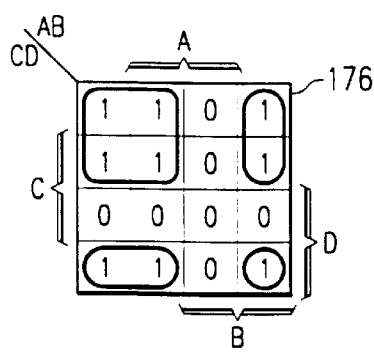
FIG. 13B illustrates a Karnaugh Map representing the AND-OR-INVERT gate in FIG. 13A.

As an example, again consider an AND-OR-INVERT logic gate as shown in FIG. 13. Recall from equation (6) that this gate has an output signal probability transfer function of $$F_s(g)=y=1−ab−cd+abcd.$$

The partial derivative of this function with respect to a is $$F_s'(A) = \frac{\partial(1 − ab − cd + abcd)}{\partial a} = −b + bcd = b(cd − 1). \tag{21}$$

$F_s'(A)$ is dependent upon three variables: b, c, and d. Therefore, there are exactly 8 input states to consider: T=<b:c:d>={000, 001, 010, . . . , 111}. However, note that if b is 0, $F_s'(A)$ evaluates to 0. Therefore, we need only consider states where b is 1:

T=<b:c:d>={100, 101, 110, 111}. Evaluating $F_s'(A)$ for these states gives:

$$F_s'(A)_{T=100}=1(0 \cdot 0−1)=−1 \tag{22}$$

$$F_s'(A)_{T=101}=1(0 \cdot 1−1)=−1 \tag{23}$$

$$F_s'(A)_{T=110}=1(1 \cdot 0−1)=−1 \tag{24}$$

$$F_s'(A)_{T=111}=1(1 \cdot 1−1)=0 \tag{25}$$

Calculating the state probability $P_T$ for these states (we need only consider those states for which $F_{Ss}'(A)$ is non-zero), we obtain:

$$P_{T=100}=b(1−c)(1−d)=b−bc−bd+bcd \tag{26}$$

$$P_{T=101}=b(1−c)d=bd−bcd \tag{27}$$

$$P_{T=110}=bc(1−d)=bc−bcd \tag{28}$$

Summing these $P_T$ values gives the transfer probability transfer function for input A:

$$F_t(A)=P_{T=100}+P_{T=101}+P_{T=110} \tag{29}$$
$$=(b−bc−bd+bcd)+(bd−bcd)+(bc−bcd)$$
$$=b−bcd$$
$$=b(1−cd)$$

The transfer probability at input A is then $$P_t(A)=P_t(Y) \cdot F_t(A) \tag{30}$$
$$=P_t(Y) \cdot b(1−cd)$$

The transfer probability transfer functions for the other inputs are calculated in a similar fashion:

$$F_t(A)=b(1−cd) \tag{31}$$

$$F_t(B)=a(1−cd) \tag{32}$$

$$F_t(C)=d(1−ab) \tag{33}$$

$$F_t(D)=c(1−ab) \tag{34}$$

This same result could also have been obtained by considering the logic gate as a circuit of more primitive gates, as shown in FIG. 14. Working from the output toward the inputs, and using the signal probability values for the intermediate signals E, F, and G as previously determined in equations (7), (8), and (9), the transfer probability values for signals E, F, and G, and for inputs A, B, C, and D can be determined using Table II.

TABLE II

| | | Transfer Probability Transfer Functions |
|---|---|---|
| Gate Type | Logic Function | Transfer Probability Transfer Functions $P_t(I) = P_t(Y) \cdot F_t(I)$ |
| BUFFER | Y = A | $F_t(A) = 1$ |
| INVERTER | Y = $\overline{A}$ | $F_t(A) = 1$ |
| AND | Y = A · B | $F_t(A) = P_S(B)$ |
| | | $F_t(B) = P_S(A)$ |
| NAND | | $F_t(A) = P_S(B)$ |
| | Y=$\overline{A \cdot B}$=$\overline{A} \cdot B + \overline{B}$ | $F_t(B) = P_S(A)$ |

TABLE II-continued

Transfer Probability Transfer Functions

| Gate Type | Logic Function | Transfer Probability Transfer Functions $P_t(I) = P_t(Y) \cdot F_t(I)$ |
|---|---|---|
| OR | $Y = A + B = A \cdot \overline{B} + B$ | $F_t(A) = (1 - P_S(B))$ $F_t(B) = (1 - P_S(A))$ |
| NOR | $Y + \overline{A+B} = \overline{A} \cdot \overline{B}$ | $F_t(A) = (1 - P_S(B))$ $F_t(B) = (1 - P_S(A))$ |
| XOR | $Y = A \oplus B = (A \cdot \overline{B}) + (\overline{A} \cdot B)$ | $F_t(A) = 1$ $F_t(B) = 1$ |
| XNOR | $Y = \overline{A \oplus B} = (A \cdot B) + (\overline{A} \cdot \overline{B})$ | $F_t(A) = 1$ $F_t(B) = 1$ |

From the transfer function for an INVERTER, shown in Table II, $$P_t(G) = P_t(Y), \quad (35)$$

from the transfer function for an OR gate, $$P_t(E) = P_t(G) \cdot (1-f) = P_t(Y) \cdot (1-cd), \quad (36)$$

$$P_t(F) = P_t(G) \cdot (1-g) = P_t(Y) \cdot (1-ab), \quad (37)$$

and from the transfer function for an AND gate, $$P_t(D) = P_t(F) \cdot c = P_t(Y) \cdot c(1-ab), \quad (38)$$

$$P_t(C) = P_t(F) \cdot d = P_t(Y) \cdot d(1-ab), \quad (39)$$

$$P_t(B) = P_t(E) \cdot a = P_t(Y) \cdot a(1-cd), \quad (40)$$

and $$P_t(A) = P_t(E) \cdot b = P_t(Y) \cdot b(1-cd) \quad (41)$$

which matches the previous results.

The CBA tool 20 uses this same methodology for computation of the transfer probabilities throughout the circuit. In order to perform these calculations, the CBA tool 20 must be given the transfer probability transfer functions for each primitive combinational logic gate type available in the technology library 21, or must be able to compute them from generic primitive logic models of the gate types (macro definitions). The transfer probability transfer functions are generally specified in the technology specific test configuration data file 22. If no transfer function is specified for a gate type, then a generic model for the gate type must be specified. Transfer probability transfer functions for the generic logic primitives are predefined in a default test configuration data list.

The transfer probability transfer functions for the inputs of a logic gate are, in general, dependent upon the signal probabilities appearing at the inputs of the gate. Since the calculation of these signal probability values ignores any effects introduced by reconvergent fanout, the calculation of transfer probability likewise ignores the effects of reconvergent fanout. The CBA tool 20 only computes the numerical values of the transfer probabilities as it traverses the netlist 26. When calculating the transfer probability for any gate input, the CBA tool 20 assumes that all inputs to the gate are independent.

Fault Detection and Coverage Probabilities

The fault detection probability and coverage analyzer 35 determines the fault detection and fault coverage of the circuit-under-test as described in the netlist 26. It is assumed that any signal which is propagated to a primary-output or pseudo-primary-output will affect the accumulated test signature (i.e., test signature aliasing and fault masking are ignored). Therefore, any fault origin which is properly stimulated and propagated is assumed to be detected. For any given fault in the circuit, the CBA tool 20 can estimate the probability that the fault is detected during any single clock cycle of the self-test (the fault detection probability), and, given the total number of clock cycles in the self-test, can then estimate the probability that the fault will be detected at some point during the self-test (the fault coverage probability). Averaging the fault coverage probabilities over the fault universe gives an estimate of the overall fault grade for the self-test.

For any given stuck-at-0/1 fault origin in the circuit, the detection probability for the fault is simply the product of the probability that the signal at the fault origin is exercised to the state opposite that of the stuck-at fault and the probability that the signal is then propagated to an output where it will be accumulated into the test signature. Thus, the detection probability can be calculated from the signal probability and the transfer probability, as follows:

$$P_d(X_{SA0}) = P^S(X) \cdot P_t(X) \quad (42)$$

$$P_d(X_{SA1}) = (1 - P_S(X)) \cdot P_t(X) \quad (43)$$

where $P_S(X)$ is the signal probability at fault origin X, $P_t(X)$ is the transfer probability at X, $P_d(X_{SA0})$ is the detection probability for a stuck-at-0 fault at X, and $P_d(X_{SA1})$ is the detection probability for a stuck-at-1 fault at X Fault origin X may be a node (net), a gate input pin, or a gate output pin.

The fault coverage probability is derived by first considering the probability that a fault remains undetected by the self-test. If the probability of detection of a fault X during any single clock cycle of the self-test is $P_d(X)$, then the probability that the fault is undetected, $P_{uc}(X)$, is $$P_{ud}(X) = 1 - P_d(X) \quad (44)$$

If there are n clock cycles in the self-test, then the probability that the fault remains undetected during the entire test, $P_{uc}(X)$, is $$P_{uc}(X) = P_{ud}(X)^n = (1 - P_d(X))^n \quad (45)$$

The probability that the fault is detected at some point in the self-test is the converse of the probability that it remains undetected; thus:

$$P_c(X) = 1 - (1 - P_d(X))^n \quad (46)$$

where $P_d(X)$ is the fault detection probability for a fault (stuck-at-0 or stuck-at-1) at fault origin X, n is the number of clock cycles in the self-test, and $P_c(X)$ is the fault coverage for the fault at fault origin XY The overall circuit fault grade is the average of the fault coverage probabilities for all detectable faults in the fault universe, and is given by:

$$G_f = \frac{\sum_N P_c(X)}{N} \qquad (47)$$

where $P_c(X)$ is the fault coverage probability at detectable fault origin X, N is the total number of detectable faults, and $G_f$ is the overall circuit fault grade.

Testpoint Selection

The CBA tool 20 provides the capability to increase the fault detection grade of the CBIST self-test by the insertion of testpoints into selected nodes of the circuit-under-test using the testpoint searcher and selection analyzer 39 and the testpoint inserter 47. A testpoint is an additional test structure which is defined to have an input with a transfer probability of 1, and an output with a signal probability of ½.

The problem of finding an optimum placement of testpoints into a circuit in order to increase the circuit fault detection grade above some predefined minimum value is NP-complete—for circuits of non-trivial size, it can not be solved in a reasonable time. The testpoint searcher and selection analyzer 39 of the CBA tool is 20, therefore, uses a heuristic algorithm to find a "good" set of node locations for testpoint insertion.

The algorithm used by the testpoint searcher and selection analyzer 39 calculates the potential effect of the insertion of a testpoint at a particular node by labeling the node as a pseudo-testpoint. When a node is labeled as a pseudo-testpoint (i.e., the pseudo-testpoint is 'added' at the node), its signal probability value is set to ½ and its transfer probability value is set to 1. These new signal and transfer probability values are then propagated through the netlist 26, and new fault detection and coverage probability values are calculated for all affected fault origins. The change in the sum total of coverage probabilities gives a measure of the effectiveness of the pseudo-testpoint.

The algorithm employed by the testpoint searcher and selection analyzer 39 is a three-phase procedure which first finds a set of pseudo-testpoints that increase the controllability of all nodes of the circuit above a minimum value. Secondly, it finds a set of pseudo-testpoints that increase the observability of nodes which have low fault coverage. Thirdly, it combines these two sets of pseudo-testpoints, ranks them, and selects a sub-set of the most effective testpoints such that the desired fault coverage for the circuit described in the netlist 26 is attained.

Phase 1—Controllability Enhancement

The object of the controllability enhancement phase is to ensure that every node in the circuit has a sufficient signal toggle rate. The toggle rate is related to signal probability, so that a sufficient toggle rate is defined by $$P_{sMIN} < P_s(X) < (1-P_{sMIN}) \text{ for every node X} \qquad (48)$$

where $P_{sMIN}$ is the minimum signal probability value allowed on a node. $P_{sMIN}$ is the signal probability value which, if the node could be made to have perfect observability (i.e., $P_t$ for the node was made to be 1), would yield an acceptable fault detection probability for a stuck-at-0 fault on the node. Thus, $P_{sMIN}$ is defined by $$P_{sMIN} = M \cdot P_{dMIN} \qquad (49)$$

where M is a controllability multiplier factor (specified by the user), and $P_{dMIN}$ is the minimum required detection probability. $P_{dMIN}$ is that value of fault detection probability which would give a fault coverage probability value above the confidence level (as specified by the user), and is given by $$P_{dMIN} = 1 - (1-c)^{1/n} \qquad (50)$$
$$= 1 - e^{\ln(1-c)/n}$$

where c is the confidence level, and n is the number of BIST clock cycles.

Controllability pseudo-testpoints are added to the circuit so that every node in the circuit has a sufficient signal toggle rate. Controllability pseudo-testpoints are determined in a manner such that no node will have a pseudo-testpoint added until all upstream (toward inputs) combinational circuitry has been traversed, so that nodes nearer the circuit inputs will have pseudo-testpoints added first. When a node is found with insufficient toggle rate, then pseudo-testpoints are added to the inputs of the node's driving gate until the gate output (i.e., the node under consideration) has a sufficient toggle rate.

For each pseudo-testpoint, tp, the $P_s$, $P_t$, $P_d$, and $P_c$ values are recalculated for all affected nodes. The recalculation assumes that the pseudo-testpoint node has an input transfer probability of 1, and an output signal probability of ½.

Modifying the transfer probability, $P_t$, of the pseudo-testpoint node affects the transfer probability of all nodes in its fanin cone. Modifying the signal probability, $P_s$, of the pseudo-testpoint node affects the signal probability of all nodes in its fanout cone. Additionally, modifying the signal probability of an input to a gate affects the transfer probability of the other inputs of the gate, and the fanin cones of those other inputs. In turn, modification of the $P_s$ or $P_t$ value for a node affects the detection probability, $P_d$, and coverage probability, $P_d$, for all fault origins on the node.

The effect on the overall circuit fault detection due to a pseudo-testpoint is measured by $$E(tp) = \sum_X \Delta P_c(X) \qquad (51)$$

where $\Delta P_c(X)$ is the change in coverage probability at fault origin X, and E(tp) is the measure of the effect on overall circuit fault detection coverage due to pseudo-testpoint tp. Fault origin X is any node (net), gate input pin, or gate output pin which was affected (i.e., the $P_s$ or $P_t$ value for the fault origin was altered) by the insertion of the pseudo-testpoint.

A formal statement of the phase-1 algorithm for finding and adding controllability pseudo-testpoints is given below in the nlce and cce procedures. Procedure nlce calls the cce procedure to find and add pseudo-testpoints for every node in the netlist 26. The cce procedure is a recursive routine which traverses backward through a logic cone, starting at the apex of the cone, adding controllability pseudo-testpoints to the cone so that every node in the cone has adequate signal toggle rate. If a node has already been traversed by a previous call to cce, then cce terminates the traversal of that branch of the cone.

```
procedure nlce (NL : netlist);
{
    Netlist Controllability Enhancement - Find controllability pseudo-
    testpoints for netlist NL, and return the set of pseudo-testpoints TP_c.
}
    TP_c := ∅;    { set of controllability pseudo-testpoints }
    for every node n in NL do
        call cce (n);
    end; { for every n }
    return TP_c;
end. { procedure nlce }
procedure cce (n : node);
{
    Cone Controllability Enhancement - Recursively find
    controllability pseudo-testpoints for logic cone whose apex is node
    n, such that node n, and all
nodes in its input logic cone have adequate signal toggle rate.
}
    NL := netlist including node n;
    if n has already been traversed then return;
    mark n as traversed;
    S := ∅;        { set of inputs of n }
    for every gate output pin o which connects to n do
        g := gate for which o is output pin;
        for every input pin i of gate g do
            ni := net which connects to i;
            call cce (ni);
            S := S ∪ {ni};    { add ni to S }
        end; { for every i }
    end; { for every o }
    while (P_sMIN < P_s(n) < (1 − P_sMIN)) do
        { find a pseudo-testpoint location }
        find node tp, where tp ∈ S, that has greatest |(½ − P_s(tp))|,
            and is a valid testpoint location;
        if no valid tp was found then return;
        S := S \ {tp};    { remove tp from S }
        label node tp as a pseudo-testpoint;
        P_s(tp) := ½;
        P_t(tp) := 1;
        propagate new P_s(tp) and P_t(tp) values through NL and
            calculate effectiveness measure E(tp);
        { TP_c is global to this procedure }
        TP_c := TP_c ∪ {tp};    { add tp to TP_c }
    end; { while }
end. { procedure cce }
```

Phase 2—Observability Enhancement

The object of the observability enhancement phase is to find a set of pseudo-testpoints that increase the circuit observability so as to ensure that every fault origin in the circuit has a minimum fault coverage probability. Since, after the controllability enhancement phase, every node in the circuit has a minimum signal toggle rate, it is possible to increase the fault detection probability, and hence the fault coverage probability, above a minimum level for every fault origin in the circuit by the insertion of a sufficient number of pseudo-testpoints.

For every resistant input pin fault origin (one which has a coverage probability below the confidence level) the algorithm finds a potential pseudo-testpoint which raises the coverage probability above the confidence level and is downstream from the gate input pin.

It is necessary to consider only input pin faults since any stimulus pattern which detects a stuck-at fault on an input pin will also detect the same stuck-at fault on the net to which it is connected, and also the stuck-at fault on the output pin which drives the net (i.e., the gate output pin fault collapses into the node fault, which collapses into the input pin fault). Thus, considering only this sub-set of resistant faults results in a set of pseudo-testpoints which cover all resistant faults, while reducing the execution time of the algorithm.

The same potential pseudo-testpoint may be found for several different resistant faults. Since the potential pseudo-testpoint will raise the coverage probability for each of the resistant faults with which it is associated above the confidence level, a measure of the effectiveness of the potential pseudo-testpoint is given by the sum of the differences between the original coverage probabilities for the resistant faults and the confidence level:

$$m(tp) = \sum_{X} (c - P_c(X)) \tag{52}$$

where c is the confidence level, $P_c(X)$ is the original coverage probability for resistant fault X, and m(tp) is the effectiveness measure for potential pseudo-testpoint tp.

The potential pseudo-testpoints are ranked according to their effectiveness measure, m(tp), and then added to the netlist 26 according to ranking. For each added pseudo-testpoint, tp, the $P_s$, $P_t$, $P_d$, and $P_c$ values are recalculated for all affected nodes, and the effect on overall circuit fault detection grade, E(tp), is calculated.

A formal statement of the phase-2 algorithm for finding observability pseudo-testpoints is given below in the nloe and xotp procedures. The nloe procedure searches every gate input pin in the netlist 26. If a stuck-at-0/1 fault on the input pin has a coverage probability below the confidence level, then the xotp procedure is called to search forward through the netlist 26 to find a potential pseudo-testpoint which will raise the transfer probability at the gate input pin such that the coverage probability is raised above the confidence level. The potential observability pseudo-testpoints are then sorted according to the effectiveness measure m(tp), and added to the netlist 26.

```
procedure nloe (NL : netlist);
{
    Netlist Observability Enhancement - Find observability
    pseudo-testpoints for netlist NL, and return set of pseudo-
    testpoints TP_o.
}
    TP_p := ∅;    { set of potential observability pseudo-testpoints }
    for every node n in NL do
        for every gate input pin i which connects to n do
            { c = confidence level }
            if P_c(SA0(i)) < c then
                { find a potential pseudo-testpoint to cover SA0 fault
                on i }
                tp := call xotp (i, (P_dMIN / P_s(i)));
                { increment the effectiveness measure for tp }
                m(tp) := m(tp) + (c − P_c(SA0(i)));
                { add tp to set of potential pseudo-testpoints }
                TP_p := TP_p ∪ {tp};
            end; { if low fault coverage }
            if P_c(SA1(i)) < c then
                { find a potential pseudo-testpoint to cover SA1 fault
                on i }
                tp := call xotp (i, (P_dMIN / (1 − P_s(i))));
                { increment the effectiveness measure for tp }
                m(tp) := m(tp) + (c − P_c(SA0(i)));
                { add tp to set of potential pseudo-testpoints }
                TP_p := TP_p ∪ {tp}
            end; { if low fault coverage }
        end; { for every input pin i }
    end; { for every node n }
    TP_o = ∅; { ordered set of observability pseudo-testpoints }
    while TP_p ≠ ∅ do
        find node tp, where tp ∈ TP_p, that has greatest effective
            measure m(tp);
        TP_p := TP_p \ {tp}; (remove tp from TP_p }
        label node tp as a pseudo-testpoint;
        P_s(tp) := ½;
        P_t(tp) := 1;
        propagate new P_s(tp) and P_t(tp) values through NL and
```

-continued

```
        calculate effectiveness measure E(tp);
    TP_o := TP_o ∪ {tp};  { add tp to TP_o }
    end;  { while }
    return TP_o;
end.  { procedure nloe }
procedure xotp (i : input pin; ptmin : real);
    {
        Fault Observability Test-Point - Recursively search netlist to
            find a potential observability pseudo-testpoint for gate input
            pin i, such that the transfer probability at i is at least ptmin.
    }
    g := gate of which i is an input pin;
    y := output pin of gate g;
    ptymin := ptmin · P_t(y) / P_t(i);
    n := net connected to y;
    if ptymin > 1 then return null;
    if n is a valid testpoint location then
        tp := n;
    else
        tp := null;
    end;  { if n }
    S := Ø;        { set of input pins }
    forevery gate input pin i which connects to n do
        S := S ∪ {i};  { add i to S }
    end;  { for every i }
    while S ≠ Ø do
        { find likely candidate input pin }
        find input pin i, where i ∈ S, that has least P_t(i);
        S := S \ {i};  { remove i from S }
        n := call xotp (i, ptymin);
        if n is not null then
            tp := n;
            break;
        end;  { if n }
    end;  { while }
    return tp;
end.  { procedure xotp }
```

Phase 3—Combined TestToint Ranking

The object of this phase is to select a minimal sub-set of the total set of pseudo-testpoints which achieves the desired fault detection coverage.

The controllability and observability pseudo-testpoint sets are combined into a single set, and are ranked according to their effectiveness measure, E(tp). The circuit is restored to the state before any pseudo-testpoint insertion, so that the $P_s$, $P_t$, $P_d$, and $P_c$ values for all nodes are restored to their original values. The combined set of pseudo-testpoints are then added to the circuit according to their new ranking, until the minimum required fault detection coverage (as specified by the user) is reached. For each newly added pseudo-testpoint, tp, the $P^s$, $P_t$, $P_d$, and $P_c$, values are recalculated for all affected nodes, and the effectiveness measure, E(tp), is calculated. To ensure that a minimal sub-set of testpoints is found, this process is repeated using the new sub-set of pseudo-testpoints, with their newly calculated effectiveness measures.

A formal statement of the complete three-phase algorithm for finding pseudo-testpoints is given below in the tps procedure. The phase-3 processing is found within this procedure.

```
procedure tps (NL : netlist; mincov : real);
{
    Testpoint Search - Search for testpoints to be added to netlist NL
    that increase fault detection coverage for NL to at least mincov.
    Return the set of testpoints.
}
    calculate P_s, P_t, P_d, and P_c values for all fault origins in NL;
    calculate overall fault grade G_f for NL;
    { save original state of NL, and all P_s, P_t, P_d, and P_c values }
    tempNL := NL;
    { PHASE - 1 }
    { find and add controllability enhancement pseudo-testpoints }
    TP_c := call nlce (NL);
    { PHASE - 2 }
    { find and add observability enhancement pseudo-testpoints }
    TP_o := call nloe (NL);
    { PHASE - 3 }
    { combine controllability and observability enhancement
        pseudo-testpoints
    }
    TP_t := TP_c ∪ TP_o;
    for i := 1 to 2 do
        { restore original state of NL, and all P_s, P_t, P_d, and P_c values }
        NL := tempNL;
        TP = Ø;  { set of pseudo-testpoints }
        { add pseudo-testpoints from set TP_t, ordered (ranked) by
            effectiveness
            measure E(tp), to netlist NL, until overall circuit fault grade
            G_f is at
    or
            above minimum required fault coverage mincov }
        while TP_t ≠ Ø and G_f < mincov do
            find node tp, where tp ∈ TP_t, that has greatest E(tp);
            TP_t := TP_t \ {tp};  { remove tp from TP_t }
            label node tp as a pseudo-testpoint;
            P_s(tp) := ½;
            P_t(tp) := 1;
            propagate new P_s(tp) and P_t(tp) values through NL and
                calculate effectiveness measure E(tp);
            TP := TP ∪ {tp};  { add tp to TP }
        end;  { while }
        TP_t := TP;  { update set of testpoints }
    end;  { for i }
    return TP;
end.  { procedure tps }
```

The output of the three phase heuristic algorithm is an ordered list of testpoint locations, with the most effective (i.e., the testpoint with the greatest positive effect on overall fault detection grade) given first. The testpoint searcher and selection analyzer 39 then, using the ordered list of testpoint locations, inserts testpoints into the netlist 26 until the desired fault grade is achieved, thereby generating the output design netlist 36.

Figure 17:
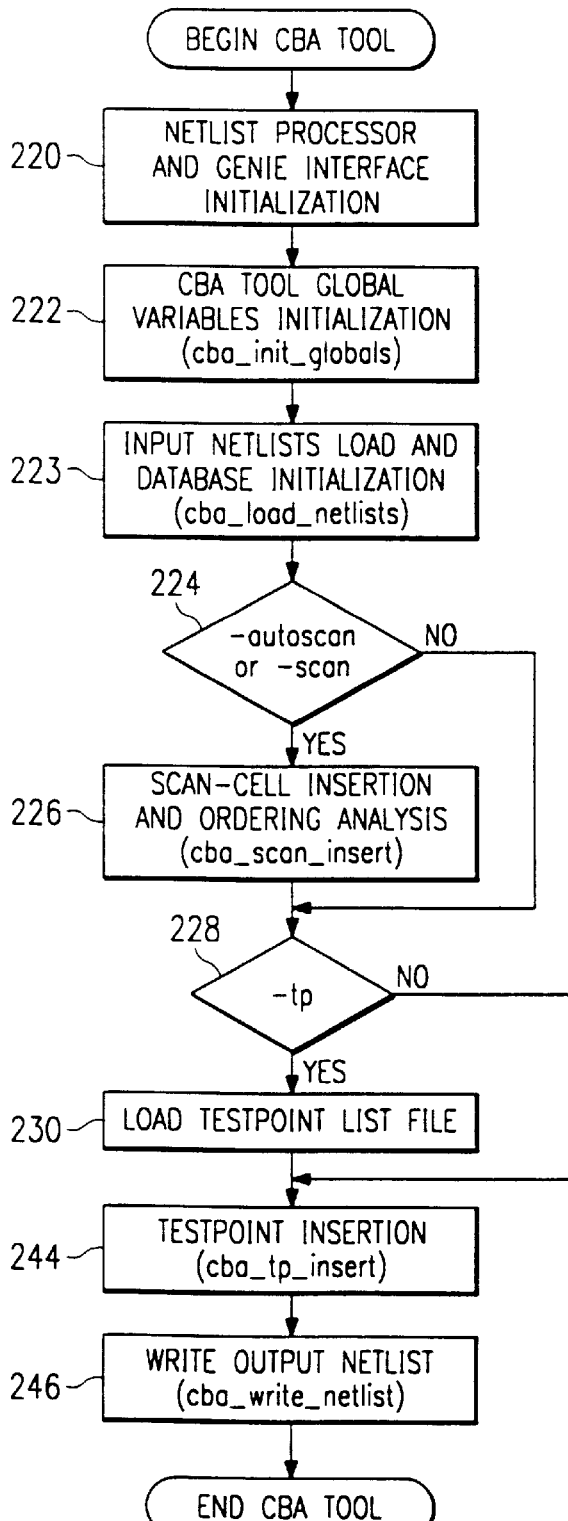
FIG. 17 shows a flowchart illustrating one embodiment of the method of the present invention.

FIG. 17 illustrates a generalized flow diagram illustrating the method of the present invention as discussed above.

Although the present invention has been described in detail, it should be understood that various changes, substitutions and alterations can be made thereto without departing from the spirit and scope of the present invention as defined by the appended claims.

What is claimed is:

1. A computer implemented method for selecting test points to increase overall fault coverage of an electrical circuit, the computer including a memory and a display, comprising the steps of:

a) providing a netlist describing the electrical circuit in the memory of the computer, the netlist including a plurality of nodes and a plurality of connections between the plurality of nodes;

b) determining a signal probability and a transfer probability associated with the nodes in the netlist;

c) selecting a set of controllability pseudo-testpoint nodes by iterating through the nodes in the netlist to select a current low controllability node, the current low controllability node having a signal probability outside a first preset range, and performing steps c1 through c3 upon the current low controllability node;

c1) determining which nodes are in the fanin cone of the current low controllability node selected in step c, thereby selecting a current set of fanin nodes, c2) selecting a new pseudo-testpoint node from the current set of fanin nodes, and inserting the new pseudo-testpoint node into the netlist, wherein the inserting comprises adding the new pseudo-testpoint node to the set of controllability pseudo-testpoint nodes, temporarily setting the signal probability of the new pseudo-testpoint node to ½, temporarily setting the transfer probability of the new pseudo-testpoint node to 1, thereby affecting the signal probabilities and transfer probabilities of at least the current low controllability node; and temporarily updating the signal probability and transfer probability of the nodes in the netlist;

c3) repeating steps c2 through c3, unless the current low controllability node's updated signal probability is within the first preset range;

d) continuing the iteration of step c until all low controllability nodes have been selected;

e) upon completion of the step c iteration, using steps f through i to select a set of observability pseudo-testpoint nodes;

f) determining a set of potential faults for the netlist, the set of potential faults including a plurality of faults;

g) selecting a set of potential observability pseudo-testpoint nodes by iterating through the faults in the set of potential faults to select a current resistant fault, the current resistant fault having a fault coverage probability below a preset confidence level, and performing steps g1 through g2 upon the current low observability node;

g1) determining which nodes are downstream from the current resistant fault selected in step g, thereby selecting a current set of downstream nodes;

g2) selecting a current potential observability pseudo-testpoint node from the current set of downstream nodes, incrementing an effectiveness measure for the current potential observability pseudo-testpoint node, and adding the current potential observability pseudo-testpoint node to a set of potential observability pseudo-testpoint nodes;

h) continuing the iteration of step g until all resistant faults have been selected;

i) upon completion of the step g iteration, repeatedly selecting a new pseudo-testpoint node from the set of potential observability pseudo-testpoint nodes and inserting the new pseudo-testpoint node into the netlist, wherein the selection order is based on the effectiveness measures of step g2, and inserting the new pseudo-testpoint node into the netlist comprises adding the new pseudo-testpoint node to the set of observability pseudo-testpoint nodes, temporarily setting the signal probability of the new pseudo-testpoint node to ½, temporarily setting the transfer probability of the new pseudo-testpoint node to 1, and temporarily updating the signal probability and transfer probability of the nodes in the netlist;

j) ranking the set of controllability pseudo-testpoint nodes and observability pseudo-testpoint nodes in accordance with a potential effectiveness thereby generating a combined set of pseudo-testpoints, each of the pseudo-testpoints in the combined set having an associated rank;

k) resetting all the temporary signal probabilities and temporary transfer probabilities to the probabilities determined in step b; and l) repeatedly inserting one of the testpoints from the combined set of pseudo-testpoints into the netlist in accordance with the associated rank until a minimum required fault coverage for the electrical circuit described in the netlist is obtained.

2. The method of claim 1, where selecting a new pseudo-testpoint node from the current set of fanin nodes comprises determining which node in the current set of fanin nodes has a signal probability value furthest from ½.

3. The method of claim 1, wherein the inserting of step c2 further comprises removing the new pseudo-testpoint node from the current set of fanin nodes.

4. The method of claim 1, wherein the potential effectiveness of step j for the controllability pseudo-testpoint nodes is determined as each pseudo-testpoint node is inserted during step c2.

5. The method of claim 1, wherein the potential effectiveness of step j for the observability pseudo-testpoint nodes is determined as each pseudo-testpoint node is inserted during step i.

6. The method of claim 1, wherein the set of potential faults comprises only input pin faults.

7. The method of claim 1, wherein the set of potential faults comprises stuck-at-zero faults.

8. The method of claim 1, wherein the set of potential faults comprises stuck-at-zero and stuck-at-one faults.

9. The method of claim 1, wherein the method further comprises generating a scan path comprising a plurality of scan cells through the plurality of nodes in the netlist in response to a user request.

10. The method of claim 9, wherein the generating step occurs before step c of claim 1.

11. The method of claim 9, wherein the generating step includes the step of ordering the plurality of scan cells to eliminate register adjacency.

12. The method of claim 9, wherein the generating step includes the step of inserting dummy scan cells into the scan path to eliminate register adjacency.

13. The method of claim 9 wherein the generating step includes the steps of ordering the plurality of scan cells; and inserting dummy scan cells into the scan path to eliminate register adjacency.

14. A computer implemented method for selecting test points to increase overall fault coverage of an electrical circuit, the computer including a memory and a display, comprising the steps of:

a) providing a netlist describing the electrical circuit in the memory of the computer, the netlist including a plurality of nodes and a plurality of connections between the plurality of nodes;

b) determining a signal probability and a transfer probability associated with the nodes in the netlist;

c) selecting a set of controllability pseudo-testpoint nodes by iterating through the nodes in the netlist to select a current low controllability node, the current low controllability node having a signal probability outside a first preset range, and performing steps c1 through c3 upon the current low controllability node;

c1) determining which nodes are in the fanin cone of the current low controllability node selected in step c, thereby selecting a current set of fanin nodes;

c2) selecting a new pseudo-testpoint node from the current set of fanin nodes, and inserting the new pseudo-testpoint node into the netlist, wherein the inserting comprises adding the new pseudo-testpoint node to the set of controllability pseudo-testpoint nodes, temporarily setting the signal probability of the new pseudo-testpoint node to ½, temporarily setting the transfer probability of the new pseudo-testpoint node to 1, thereby affecting the signal probabilities and transfer probabilities of at least the current low controllability node; and temporarily updating the signal probability and transfer probability of the nodes in the netlist:

c3) repeating steps c2 through c3, unless the current low controllability node's updated signal probability is within the first preset range;

d) continuing the iteration of step c until all low controllability nodes have been selected;

e) upon completion of the step c iteration, selecting a set of observability pseudo-testpoint nodes;

f) ranking the set of controllability pseudo-testpoint nodes and observability pseudo-testpoint nodes in accordance with a potential effectiveness thereby generating a combined set of pseudo-testpoints, each of the pseudo-testpoints in the combined set having an associated rank; and g) resetting all the temporary signal probabilities and temporary transfer probabilities to the probabilities determined in step b;

h) repeatedly inserting one of the testpoints from the combined set of pseudo-testpoints into the netlist in accordance with the associated rank until a minimum required fault coverage for the electrical circuit described in the netlist is obtained.

15. The method of claim 14, where selecting a new pseudo-testpoint node from the current set of fanin nodes comprises determining which node in the current set of fanin nodes has a signal probability value furthest from ½.

16. The method of claim 14, wherein the inserting of step c2 further comprises removing the new pseudo-testpoint node from the current set of fanin nodes.

17. The method of claim 14, wherein the potential effectiveness of step f for the controllability pseudo-testpoint nodes is determined as each pseudo-testpoint node is inserted during step c2.

18. A computer implemented method for selecting test points to increase overall fault coverage of an electrical circuit, the computer including a memory and a display, comprising the steps of:

a) providing a netlist describing the electrical circuit in the memory of the computer, the netlist including a plurality of nodes and a plurality of connections between the plurality of nodes;

b) determining a signal probability and a transfer probability associated with the nodes in the netlist;

c) selecting a set of controllability pseudo-testpoint nodes;

d) determining a set of potential faults for the netlist, the set of potential faults including a plurality of faults;

e) selecting a set of potential observability pseudo-testpoint nodes by iterating through the faults in the set of potential faults to select a current resistant fault, the current resistant fault having a fault coverage probability below a preset confidence level, and performing steps e1 through e2 upon the current low observability node;

e1) determining which nodes are downstream from the current resistant fault selected in step e, thereby selecting a current set of downstream nodes;

e2) selecting a current potential observability pseudo-testpoint node from the current set of downstream nodes, incrementing an effectiveness measure for the current potential observability pseudo-testpoint node, and adding the current potential observability pseudo-testpoint node to a set of potential observability pseudo-testpoint nodes;

f) continuing the iteration of step e until all resistant faults have been selected;

g) upon completion of the step e iteration, repeatedly selecting a new pseudo-testpoint node from the set of potential observability pseudo-testpoint nodes and inserting the new pseudo-testpoint node into the netlist, wherein the selection order is based on the effectiveness measures of step e2, and inserting the new pseudo-testpoint node into the netlist comprises adding the new pseudo-testpoint node to the set of observability pseudo-testpoint nodes, temporarily setting the signal probability of the new pseudo-testpoint node to ½, and temporarily setting the transfer probability of the new pseudo-testpoint node to 1, and temporarily updating the signal probability and transfer probability of the nodes in the netlist;

h) ranking the set of controllability pseudo-testpoint nodes and observability pseudo-testpoint nodes in accordance with a potential effectiveness thereby generating a combined set of pseudo-testpoints, each of the pseudo-testpoints in the combined set having an associated rank; and i) resetting all the temporary signal probabilities and temporary transfer probabilities to the probabilities determined in step b;

j) repeatedly inserting one of the testpoints from the combined set of pseudo-testpoints into the netlist in accordance with the associated rank until a minimum required fault coverage for the electrical circuit described in the netlist is obtained.

19. The method of claim 18, wherein the potential effectiveness of step h for the observability pseudo-testpoint nodes is determined as each pseudo-testpoint node is inserted during step g.

* * * * *